(12) United States Patent
Vanhoucke et al.

(10) Patent No.: US 8,362,821 B2
(45) Date of Patent: Jan. 29, 2013

(54) CHARGE CARRIER STREAM GENERATING ELECTRONIC DEVICE AND METHOD

(75) Inventors: Tony Vanhoucke, Bierbeek (BE);
Godefridus A. M. Hurkx, Best (NL);
Jan W. Slotboom, Eersel (NL)

(73) Assignee: NXP B.V., Eindhoven (NL)

( * ) Notice: Subject to any disclaimer, the term of this patent is extended or adjusted under 35 U.S.C. 154(b) by 224 days.

(21) Appl. No.: 12/743,400

(22) PCT Filed: Nov. 12, 2008

(86) PCT No.: PCT/IB2008/054737
§ 371 (c)(1),
(2), (4) Date: May 18, 2010

(87) PCT Pub. No.: WO2009/066204
PCT Pub. Date: May 28, 2009

(65) Prior Publication Data
US 2010/0246249 A1    Sep. 30, 2010

(30) Foreign Application Priority Data
Nov. 22, 2007 (EP) ..................... 07121345

(51) Int. Cl.
*H03K 17/00* (2006.01)
*H03K 17/60* (2006.01)
(52) U.S. Cl. ......... 327/411; 327/417; 327/432; 327/478
(58) Field of Classification Search .................. 365/163, 365/148
See application file for complete search history.

(56) References Cited

U.S. PATENT DOCUMENTS

| 4,607,250 | A | 8/1986 | Naylor et al. |
| 7,109,567 | B2 * | 9/2006 | Hueting et al. ............... 257/565 |
| 7,436,695 | B2 * | 10/2008 | Nirschl et al. ............... 365/148 |
| 2004/0197947 | A1 | 10/2004 | Fricke et al. |
| 2005/0098811 | A1 | 5/2005 | Ogiwara |
| 2008/0157050 | A1 * | 7/2008 | Chen ................................ 257/2 |

FOREIGN PATENT DOCUMENTS

| WO | 2004047181 A1 | 6/2004 |
| WO | 2005078489 A1 | 8/2005 |
| WO | 2006072842 A1 | 7/2006 |
| WO | 2006078505 A2 | 7/2006 |
| WO | 2007072308 A1 | 6/2007 |

OTHER PUBLICATIONS

Panko, et al; "Time-to-Fail Extraction Model for the "Mixed-Mode" Reliabity of High-Peformance SIGE Bipolar Transistors"; IEEE 44th Annual Intl Reliability Physics Symposium; San Jose, CA; US; pp. 512-515 (2006). "Grens et al., "The Effects of Scaling and BiasConfiguration on Operating-Voltage Constraints in SiGe HBTs for Mixed-Signal Circuits," IEEE Transactions on Electron Devices, vol. 54, No. 7, Jul. 2007".

* cited by examiner

*Primary Examiner* — Hoai V Ho
*Assistant Examiner* — Tri Hoang

(57) ABSTRACT

An electronic device comprising a generator for generating a stream of charge carriers. The generator comprises a bipolar transistor having an emitter region, a collector region and a base region oriented between the emitter region and the collector region, and a controller for controlling exposure of the bipolar transistor to a voltage in excess of its open base breakdown voltage ($BV_{CEO}$) such that the emitter region generates the stream of charge carriers from a first area being smaller than the emitter region surface area. The electronic device may further comprise a material arranged to receive the stream of charge carriers for triggering a change in a property of said material, the emitter region being arranged between the base region and the material.

16 Claims, 4 Drawing Sheets

CHARGE CARRIER STREAM GENERATING ELECTRONIC DEVICE AND METHOD

The present invention relates to an electronic device comprising a generator for generating a stream of charge carriers.

The present invention further relates to a method for generating a stream of charge carriers.

There are many electronic devices that utilize the generation of a stream of charge carriers such as electrons or holes to change a property of a material. Such a change in property may be permanent, for instance in the case of fuses or antifuses, or may be reversible. Examples of devices utilizing reversible property changes include display devices, wherein electron streams may be used to excite a phosphorous material from its ground state to an electronically excited state. Other examples of such electronic devices include field emitter-based devices and phase-change memories.

A phase-change memory typically comprises a material such as a chalcogenide or a semiconductor material that can be switched between different solid states such as a low-resistive crystalline state in which the atoms or molecules of the material adopt a highly ordered orientation and a high-resistive amorphous state in which the atoms or molecules are randomly ordered. The phase change is typically thermally induced by exposure of the phase-change material to a current causing the material to heat up due to its intrinsic resistance. Phase change may be triggered by melting the material and letting it cool down, which typically causes the material to adopt the amorphous state, or by heating the amorphous state to above the crystallization activation temperature but below melting point to change the amorphous state to a crystalline state.

A problem associated with such charge carrier stream generating electronic devices such as phase change memories is that the cross-sectional area of the electron stream is typically governed by the smallest achievable dimension of the lithographic process used to manufacture the device. This limits the resolution that can be achieved. In particular, in phase change memories, a certain current density must be achieved to trigger the phase change in the phase-change material. This means that a relatively large potential difference has to be placed over the electrodes surrounding the phase-change material, leading to relatively high power consumption.

This problem has been recognized in the prior art. For instance, US patent application No. US2004/0197947 A1 discloses a phase-change memory cell in which a material having a negative differential resistance (NDR) is used. Such a material exhibits a filamentary conduction channel when exposed to a sufficient potential difference. The filamentary conduction allows for the heating of an area of the phase-change material of sub-lithographic dimensions. However, a well-known drawback of NDR material based devices is that they cannot easily be produced using standard semiconductor manufacturing processes.

The present invention seeks to provide an electronic device comprising a charge carrier stream generator such an electron stream that can be manufactured using standard semiconductor manufacturing techniques.

The present invention further seeks to provide a method for generating a charge carrier stream such that a device can be realized that can be manufactured using standard semiconductor manufacturing techniques.

According to a first aspect of the present invention, there is provided an electronic device comprising a generator for generating a stream of charge carriers, the generator comprising a bipolar transistor having an emitter region, a collector region and a base region oriented between the emitter region and the collector region, and a controller for controlling exposure of the bipolar transistor to a voltage in excess of its open base breakdown voltage ($BV_{CEO}$) such that the emitter region generates the stream of charge carriers from a first area being smaller than a surface area of the emitter region.

The present invention is based on the realization that the well-known current pinch-in effect of a bipolar transistor in breakdown mode, which causes the creation of sub-lithographic scale electron and/or hole streams, can be utilized in electronic devices such as field emitters and phase-change memories. This is further based on the insight disclosed in 'Time-To-Fail Extraction Model for the "Mixed-Mode" Reliability of High-Performance SiGe Bipolar Transistors' by Panko et al. in IEEE $44^{th}$ Annual International Reliability Physics Symposium, San Jose, USA, 2006, pages 512-515, that a bipolar transistor may be operated in its breakdown regime for prolonged periods of time without detrimental effect to its performance under breakdown conditions. Hence, sub-lithographic scale electron stream sources for changing physical states in materials such as a phase-change material can be provided using conventional lithographic manufacturing processes. The bipolar transistor may be operated in reverse mode, since current pinch-in is more pronounced in this mode. In the context of the present invention, reverse mode operation comprises forward biasing the collector-base diode and reverse biasing the base-emitter diode of the bipolar transistor. The electronic device of the present invention typically comprises a plurality of bipolar transistors each arranged to trigger a change in a property of a material, e.g. a plurality of memory cells.

The doping profiles of the bipolar transistor may be chosen such that the pinch-in effect is enhanced compared to bipolar transistors designed to operate in sub-breakdown voltage regimes. For instance, a lower base doping may be chosen to increase resistance in the base region. The avalanche mechanism that leads to current pinch-in is caused by a high electric field in the base-collector depletion region. This field may be enhanced by increasing the doping concentration in the collector region, thus further amplifying current pinch-in. In an advantageous embodiment, the doping profile of the collector region comprises a lateral gradient to further concentrate the occurrence of pinch-in in the region with the high doping concentration. The lateral doping profile may be symmetrical around the centre of the collector region and may comprise a bell-shaped concentration distribution.

The electronic device may further comprise the material to be exposed to the stream of charge carriers for triggering a change in a property of said material. In a preferred embodiment, the material is a phase-change material such that the electronic device can be used as a phase-change memory. The phase-change material, which may be any known material exhibiting the aforementioned phase-change characteristics, is typically placed between the emitter region and an electrode. The phase-change material may also form at least a part of the emitter region.

The invention is further based on the insight that the location of the current pinch-in aperture in the emitter region is related to the base resistance, which may be controlled by providing a plurality of base terminals in different locations relative to the base region. This facilitates control over the shape of the potential drop across the internal base region resistance, such that the location of the current pinch-in region in the emitter region can be controlled. This can be utilized to address a plurality of charge carrier stream sensitive material regions at sub-lithographic resolution with a single bipolar transistor. According to a further aspect of the present invention, there is provided a method for generating a stream of charge carriers, comprising providing a bipolar transistor having an emitter region, a collector region and a base region oriented between the emitter region and the collector region, and controlling exposure of the bipolar transistor to a voltage in excess of its open base breakdown voltage ($BV_{CEO}$) such that the emitter region generates the stream of charge carriers from a first area being smaller than the emitter region surface area.

The method of the present invention makes it possible to trigger a property change such as a phase-change at sub-lithographic dimensions in a material without the need for complex manufacturing techniques to achieve this effect.

The invention is described in more detail and by way of non-limiting examples with reference to the accompanying drawings, wherein:

FIG. 1 schematically depicts the effects occurring in a bipolar transistor operated in avalanche conditions;

FIG. 2 schematically depicts the current pinch-in effect occurring under these conditions;

It should be understood that the Figures are merely schematic and are not drawn to scale. It should also be understood that the same reference numerals are used throughout the Figures to indicate the same or similar parts.

Figure 1:
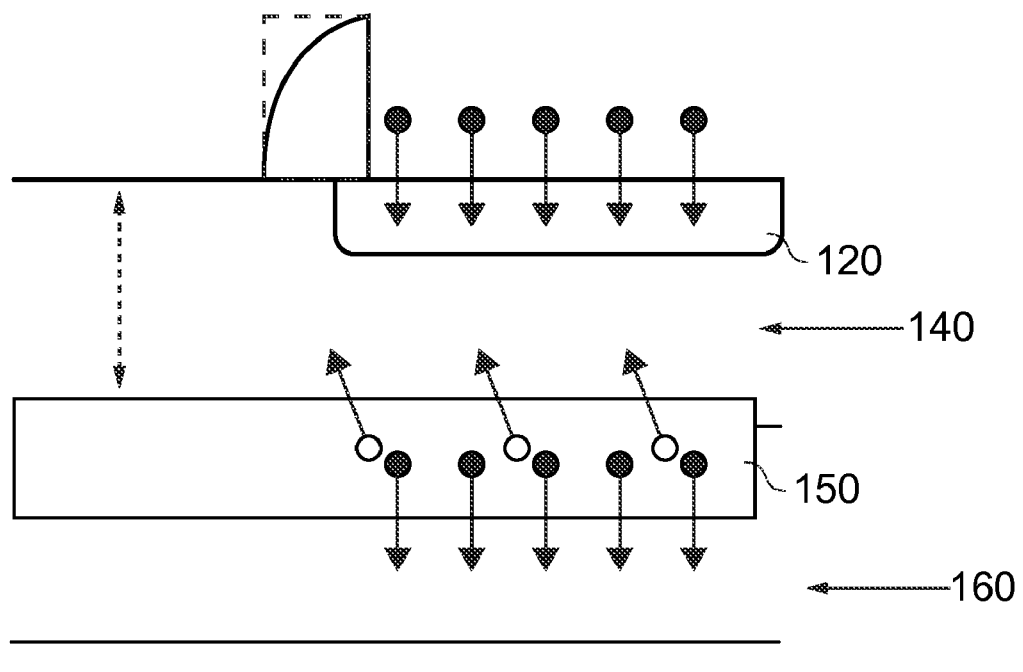

In the normal operation mode of an NPN bipolar transistor 100 as shown in FIG. 1, the electrons, which are indicated by closed circles, flow from the emitter region 120 across the base layer 140 towards the collector region 160. This makes the base current IB, which mainly consists of holes indicated by open circles, positive: IB>0. The cross sectional area of the emitter electron flow equals the area of emitter region 120. Nowadays, this region is relatively small due to improved lithographic techniques.

When operating the bipolar transistor above its (open base) breakdown voltage, $BV_{CEO}$, the base current IB becomes negative and the holes leave the base terminal due to impact ionization in the collector-base depletion region 150. This phenomenon is known as the avalanche mechanism, and is caused by the high electric field in the collector-base depletion region 150.

Figure 2:
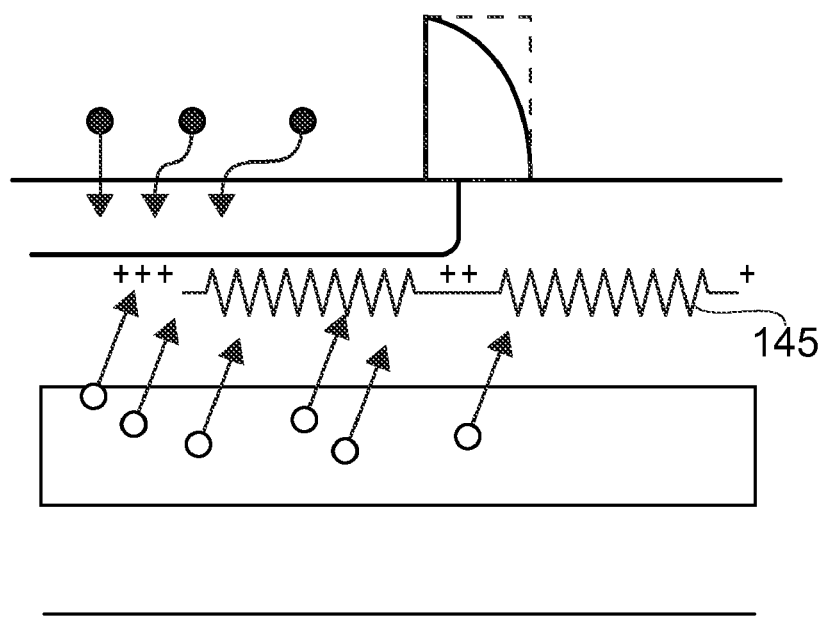

For real bipolar devices having non-zero intrinsic base resistance (RB), the electrons are concentrated towards the centre of the transistor 100 if the transistor 100 operates above $BV_{CEO}$. This effect is known as current pinch-in and is a consequence of the voltage drop across the base resistance RB by the negative hole base current. Pinching of the current becomes important when the voltage drop across the intrinsic base resistance becomes comparable to or larger than the thermal voltage: $|IB \times RB| \geq VT$, with IB<0. Current pinch-in makes the cross sectional area of the electron stream much smaller than the minimal emitter size determined by lithography. This is depicted in FIG. 2.

Optimization of the transistor doping profiles such as the doping profile of the base region 140 and the collector region 160 allows for effective exploitation of this effect in for example phase change memories. Typical collector doping concentrations in bipolar transistors optimized for normal mode use range from $1*10^{16}/cm^3$ to $1*10^{18}/cm^3$. For instance, a bipolar transistor optimized for operation in a current pinch-in mode has a collector doping concentration at the high end of this range or even exceeding this range, e.g. $1*10^{18}/cm^3$-$1*10^{19}/cm^3$. To promote confinement of the stream of charge carriers in a small part of the emitter region, the collector doping profile may exhibit a lateral gradient. The gradient may have an asymmetrical or a symmetrical shape.

Figure 3:
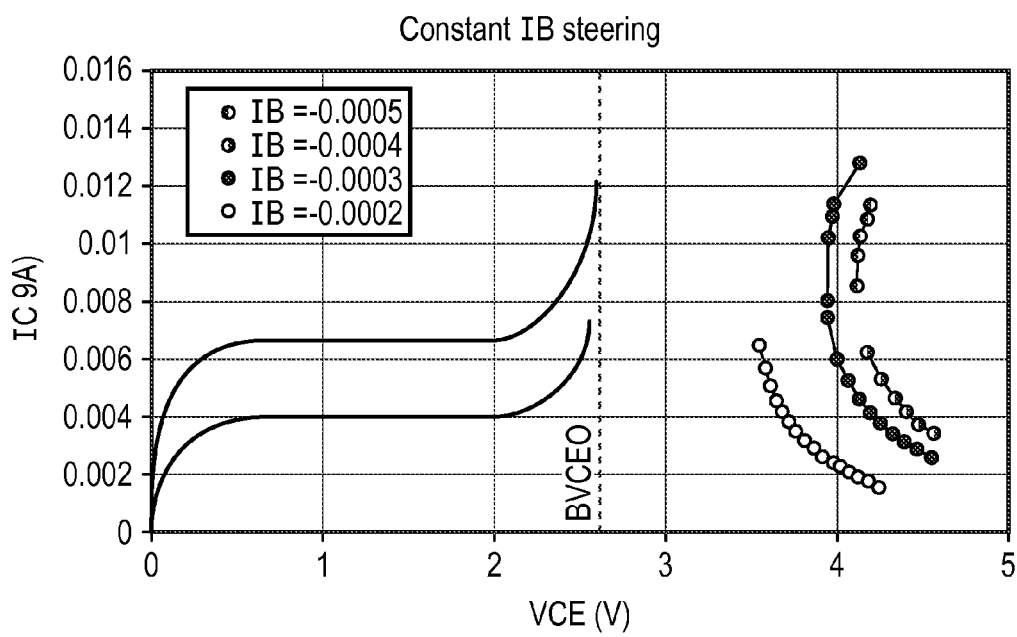
FIG. 3 shows a graph depicting collector current for positive and negative base current steering.

FIG. 3 shows the output characteristic of the transistor using base current steering. The current curves IC as a function of the collector emitter voltage $VCE<BV_{CEO}$ are the "normal" collector currents for positive base currents and are used in standard circuits. The same collector current levels, however, can be obtained for negative base current steering resulting in $V_{CE}>BV_{CEO}$, as shown in the right hand panel of FIG. 3. Under these conditions, the transistor operates in pinch-in mode. This mode is characterized by a negative base current IB, while the collector current IC remains at the same magnitude. FIG. 3 demonstrates the measurement results of the collector current under pinch-in conditions for various negative base currents IB.

Figure 4:
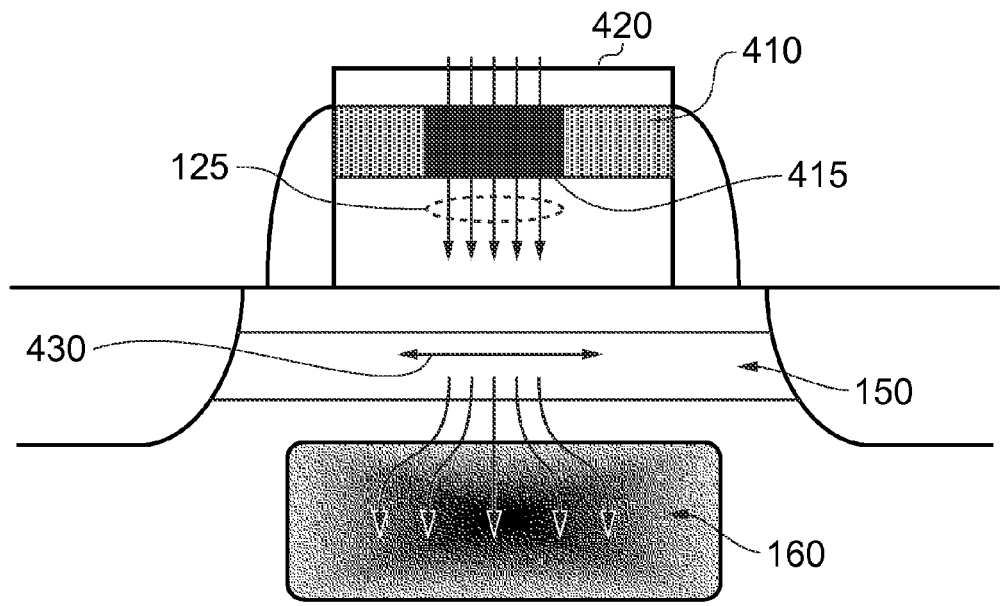
FIG. 4 shows an embodiment of a part of an electronic device of the present invention.

It will be appreciated that the pinched electron streams generated by the pinch-in effect can be used in any electronic device that requires concentrated electron beams to change a state of a material. The concept of the present invention is particularly suitable for application in phase change memories. FIG. 4 shows an example of a part of an electronic device of the present invention, in which a layer of a phase-change material 410 is added to the bipolar transistor 100. In FIG. 4, the phase change material 410 is placed on top of the emitter region 120 and covered by an electrode 420. Alternatively, the phase change material 410 may be integrated in the emitter region 120.

The width of the emitter region 120 is determined by known lithographic processes and does not require any additional, non-conventional technology steps in order to be able to generate an electron stream of sub-lithographic process dimensions. By operating the bipolar transistor 100 in avalanche regime, current-pinch-in occurs and the electrons in the emitter focus into the centre of the device, as demonstrated in FIG. 4 by region 415. As a result the current density in the emitter region 120 starts to increase drastically, not by increasing the total emitter current but by decreasing the effective emitter area, as shown by area 125. In FIG. 4, this effect is demonstrated for a transistor operating in forward bias, i.e. having a forward biased emitter-base junction and a reverse biased base-collector junction. However, a transistor in reverse operation, i.e. having a reverse biased emitter-base junction and a forward biased base-collector junction, may be more efficient.

The bipolar transistor in FIG. 4 is operated by a controller (not shown) that is designed to subject the bipolar transistor to a voltage in excess of its open base breakdown voltage $BV_{CEO}$ in its normal operation such that the emitter region generates the stream 125 of charge carriers from a first area being smaller than the emitter region surface area. It will be appreciated that such a controller may be designed in any suitable way, and may be a conventional controller adapted to subject the bipolar transistor to a voltage in excess of its breakdown voltage rather than a voltage below its breakdown voltage.

It is emphasized that other application domains for the electronic device of the present invention are equally feasible. For instance, the order of the various regions of the bipolar transistor 100 could be reversed to yield a bipolar transistor having the collector region 160 at the top of the transistor.

Such an orientation would be particularly beneficial when using the bipolar transistor 100 as a field emitter.

As previously mentioned, current pinch-in occurs when the voltage drop across the intrinsic resistance 145 of the base region 140 is high enough for the internal base-emitter voltage to exceed the externally applied voltage. This increases the internal base-emitter junction forward bias in the center of the bipolar transistor 100. Hence, the magnitude of the intrinsic base resistance is an important parameter in the bipolar transistor 100, and should be high enough to generate a sufficiently high voltage drop across the base region 140.

Furthermore, the voltage drop across the base region 140 is caused by the impact ionization generated holes in the base-collector depletion region 150. The avalanche mechanism is triggered by the high electric field in the collector-base depletion region 150. Therefore, a high collector doping is beneficial to enhancing the pinch-in effect. It is reiterated that the collector doping profile may comprise a gradient to further enhance the pinch-in effect.

Figure 5:
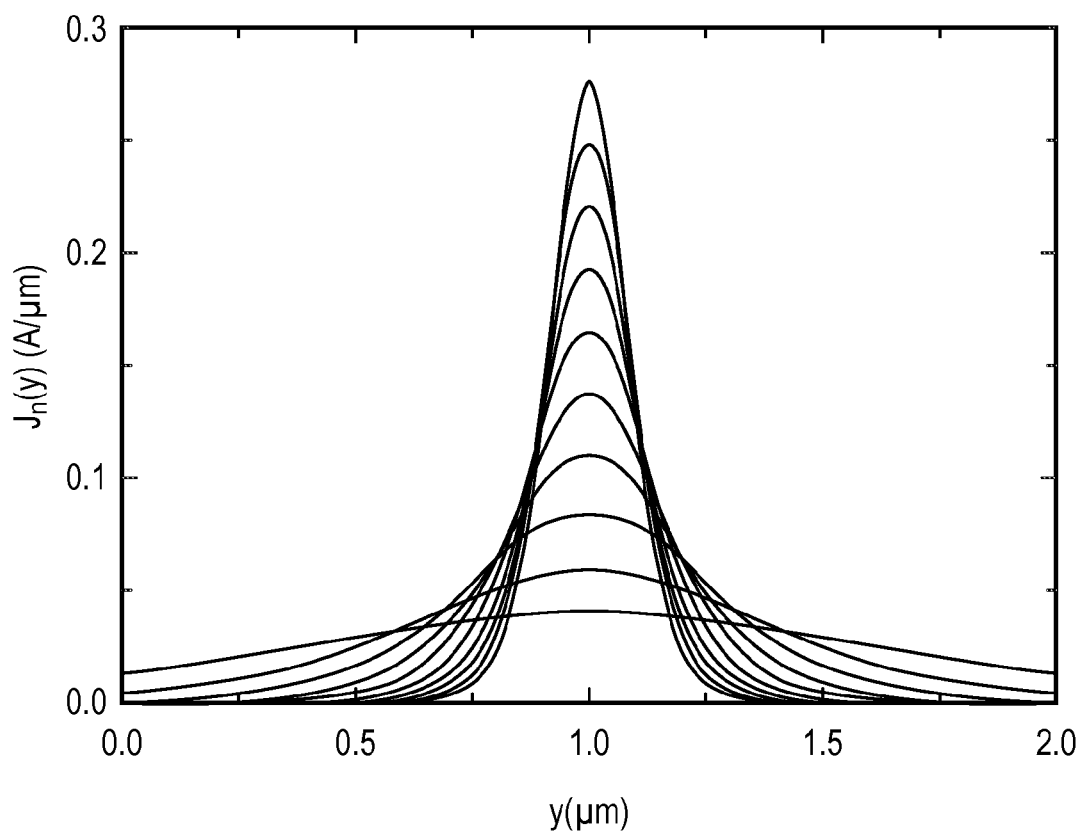
FIG. 5 shows a graph depicting the effect of base region resistance on the dimensions of the generated stream of charge carriers.

FIG. 5 shows a graph depicting the results of an analytical simulation of the influence of the intrinsic base resistance of the pinch-in effect. The y-axis shows the electron beam current density, while the pinch-in area in the emitter is shown on the x-axis. The emitter width used in the calculations is 2.0 µm. The various curves represent different intrinsic base resistances ranging from 1 k-10 kΩ. The different intrinsic base resistances are achieved by varying the base doping concentrations in the various simulation runs.

FIG. 5 shows that for an increasing intrinsic base resistance, the pinch-in stream 125 becomes more focused in the centre of the emitter region 120. The range for the intrinsic base resistance was chosen between 1 k-10 kΩ because this range comprises realistic values for the intrinsic base resistance. However, higher values are also possible. It will be appreciated that the intrinsic base resistance is determined by a combination of the base doping level and the thickness base layer thickness, and that both variables must be taken into consideration when trying to achieve the desired intrinsic base resistance.

It is further emphasized that the size of the area (A) in which pinch-in occurs further depends on the magnitude of the (negative) base current. Hence, high intrinsic base resistance and low base current can give similarly sized pinch-in areas as low intrinsic base resistance (RB) and a high base current (IB); A~RB*IB. Hence, at a constant RB, an increase in the negative base current causes a reduction in the pinch-in area.

Figure 6:
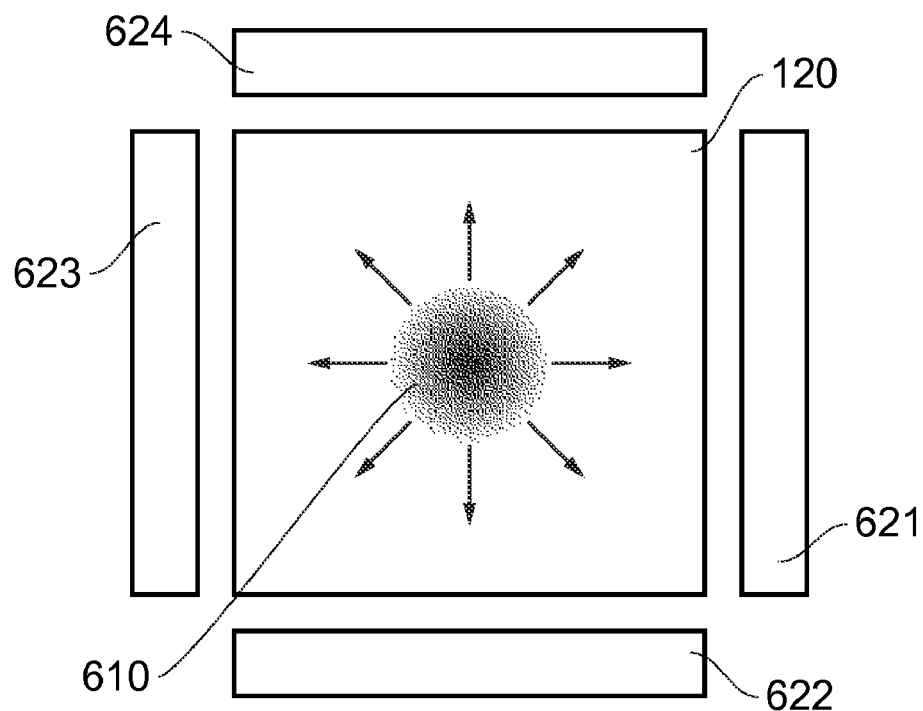
FIG. 6 shows another embodiment of an electronic device of the present invention.

FIG. 6 shows a further embodiment of a part of the electronic device of the present invention. In FIG. 6, the base region 140 is bordered by a plurality of base terminals 621-624, which are controlled by a controller (not shown). The base terminals 621-624 facilitate control over the shape of the resistance profile in the base region 140. Changing the shape of the resistance profile is translated in a shift in the location of the area 610 of the pinch-in current, as indicated by arrow 430 in FIG. 4 and the arrows in FIG. 6. The location of the current pinch-in area can be controlled by providing the base terminals 621-624 with suitable bias voltages. The controller (not shown) may dynamically determine the appropriate bias voltages. However, it is preferred that the controller comprises some form of memory such as a look-up table in which the various bias voltage values are stored, since this reduces the complexity of the controller.

Figure 7:
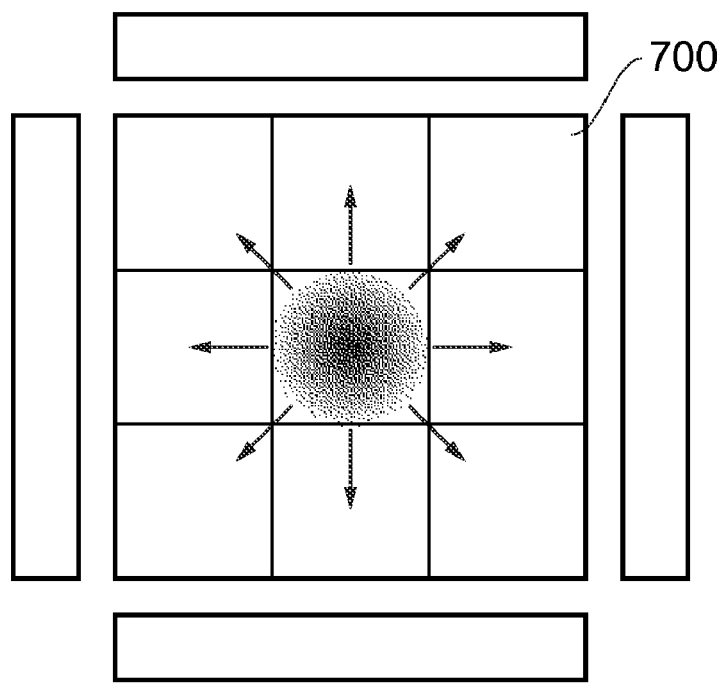
FIG. 7 shows yet another embodiment of an electronic device of the present invention.

The arrangement of FIG. 6 may be extended by dividing a material such as a phase change material covering or forming the emitter area 120 of the bipolar transistor in different sections 700. This is shown in FIG. 7. Provision of the base terminals 621-624 with appropriate bias voltages facilitates location of the area 610 of the charge carrier stream 125 in any of the sections 700. Hence, an electronic device is obtained in which a property change in a material can be controlled at sub-lithographic resolution. This makes it possible to provide a phase-change memory having memory cells with sub-lithographic dimensions, which has a significant increase of data storage capacity.

It will be appreciated that the number of base terminals 621-624 and sections 700 in FIG. 6 and FIG. 7 are chosen by way of non-limiting example only. Different numbers of base terminals and sections are within the contemplation of the present invention.

In addition to the electronic device described above, the present invention further provides a method of providing a bipolar transistor 100 having an emitter region 120, a collector region 160 and a base region 140 oriented between the emitter region 120 and the collector region 160, and controlling exposure of the bipolar transistor 100 to a voltage in excess of its open base breakdown voltage $BV_{CEO}$ such that the emitter region 120 generates the stream of charge carriers from a first area being smaller than the emitter region surface area.

The method may involve triggering a change in a property of a material by means of the stream of charge carriers. Preferably, the material is a phase-change material, wherein the stream of charge carriers comprises an electron stream generated by the bipolar transistor. The electron stream is used to change a crystalline phase of the material.

It should be noted that the above-mentioned embodiments illustrate rather than limit the invention, and that those skilled in the art will be able to design many alternative embodiments without departing from the scope of the appended claims. In the claims, any reference signs placed between parentheses shall not be construed as limiting the claim. The word "comprising" does not exclude the presence of elements or steps other than those listed in a claim. The word "a" or "an" preceding an element does not exclude the presence of a plurality of such elements. The invention can be implemented by means of hardware comprising several distinct elements. In the device claim enumerating several means, several of these means can be embodied by one and the same item of hardware. The mere fact that certain measures are recited in mutually different dependent claims does not indicate that a combination of these measures cannot be used to advantage.

The invention claimed is:

1. An electronic device comprising:
    a generator for generating a stream of charge carriers, the generator comprising:
    a bipolar transistor having an emitter region, a collector region and a base region oriented between the emitter region and the collector region, and
    a controller for controlling exposure of the bipolar transistor to a voltage in excess of its open base breakdown voltage ($BV_{CEO}$) such that the emitter region generates the stream of charge carriers from a first area being smaller than the emitter region surface area.

2. An electronic device as claimed in claim 1, further comprising a material arranged to be exposed to the stream of charge carriers for triggering a change in a property of said material.

3. An electronic device as claimed in claim 1, wherein the doping profiles of the bipolar transistor are chosen to enhance the generation of the stream of charge carriers from the first area of the emitter region.

4. An electronic device as claimed in claim 3, wherein the collector region comprises a doping profile having a lateral gradient.

5. An electronic device as claimed in claim 1, wherein the generator is arranged to be used as a field emitter.

6. An electronic device as claimed in claim 2, further comprising an electrode, and wherein the material comprises a phase-change material oriented between the electrode and the base region.

7. An electronic device as claimed in claim 6, wherein the material is oriented between the electrode and the emitter region.

8. An electronic device as claimed in claim 6, wherein the material forms at least a part of the emitter region.

9. An electronic device as claimed in claim 1, wherein the base region comprises a plurality of base terminals in different locations for controlling the location of the first area in the emitter region surface area.

10. An electronic device as claimed in claim 1, wherein the bipolar transistor is connected to be operable in reverse mode.

11. An electronic device as claimed in claim 1, comprising a plurality of bipolar transistors, each transistor being arranged to invoke a change in a property of a respective material portion.

12. A method for generating a stream of charge carriers, comprising:
   providing a bipolar transistor having an emitter region, a collector region and a base region oriented between the emitter region and the collector region; and
   controlling exposure of the bipolar transistor to a voltage in excess of its open base breakdown voltage ($BV_{CEO}$) such that the emitter region generates the stream of charge carriers from a first area being smaller than the emitter region surface area.

13. A method as claimed in claim 12, further comprising:
   providing a material arranged to receive the stream of charge carriers; and
   triggering a change in a property of said material with the stream of charge carriers.

14. A method as claimed in claim 13, wherein the material is a phase-change material, and wherein triggering a change in the property comprises changing a crystalline phase of the material.

15. A method as claimed in claim 12, wherein the base region of the bipolar transistor comprises a plurality of base terminals in different locations, the method further comprising controlling the location of the first area in the emitter region surface area by connecting a predefined number of said base terminals to a control signal.

16. A method as claimed in claim 12, further comprising operating the bipolar transistor in reverse mode.

* * * * *